US008728355B2

(12) United States Patent
Kuroki

(10) Patent No.: US 8,728,355 B2
(45) Date of Patent: May 20, 2014

(54) ELECTRODE AND METHOD FOR MANUFACTURING THE SAME

(75) Inventor: Masakatsu Kuroki, Kanagawa (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/350,973

(22) Filed: Jan. 16, 2012

(65) Prior Publication Data

US 2013/0017483 A1 Jan. 17, 2013

Related U.S. Application Data

(60) Provisional application No. 61/432,765, filed on Jan. 14, 2011.

(51) Int. Cl.
*H01B 1/16* (2006.01)
*H01B 1/22* (2006.01)

(52) U.S. Cl.
USPC ........................................ 252/512; 430/270.1

(58) Field of Classification Search
USPC ........................................ 252/512; 430/270.1
See application file for complete search history.

(56) References Cited

U.S. PATENT DOCUMENTS

| | | | | |
|---|---|---|---|---|
| 4,070,517 | A | 1/1978 | Kazmierowicz | |
| 4,409,261 | A * | 10/1983 | Kuo | 427/102 |
| 4,937,016 | A * | 6/1990 | Suehiro et al. | 252/512 |
| 5,645,765 | A * | 7/1997 | Asada et al. | 252/519.51 |
| 7,303,854 | B2 * | 12/2007 | Hayakawa | 430/270.1 |
| 7,582,229 | B2 * | 9/2009 | Lee et al. | 252/512 |
| 7,736,545 | B2 * | 6/2010 | Konno | 252/512 |
| 8,129,088 | B2 * | 3/2012 | Kuroki | 430/270.1 |
| 2006/0158305 | A1 * | 7/2006 | Tanka et al. | 338/223 |

* cited by examiner

*Primary Examiner* — Mark Kopec

(57) ABSTRACT

The invention relates to an electrode that can be formed by firing in air a conductive paste comprising a copper powder, a boron powder, an additional inorganic powder, a glass frit, and an organic medium, wherein the additional inorganic powder is selected from the group consisting of silica powder, indium tin oxide powder, zinc oxide powder, alumina powder, and mixture thereof.

8 Claims, 1 Drawing Sheet

(A)
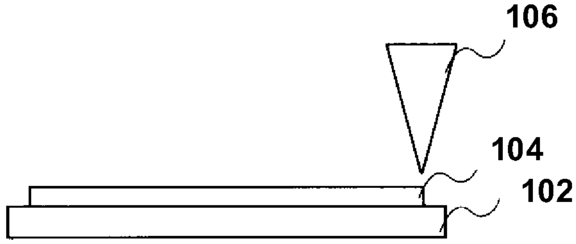
(B)
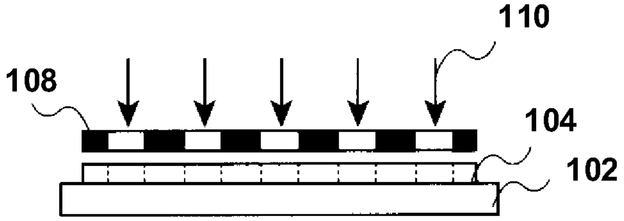
(C)
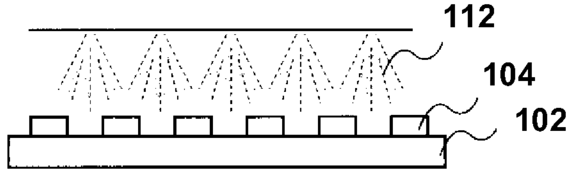
(D)
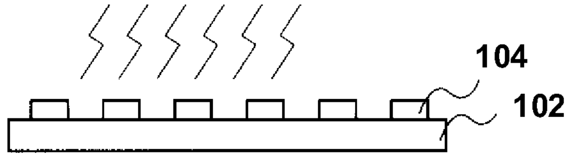
(E)
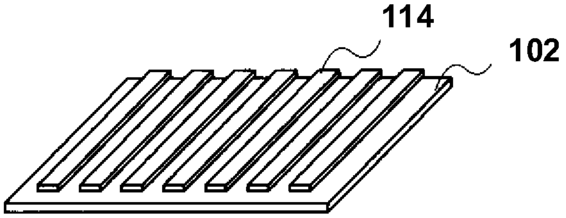

ELECTRODE AND METHOD FOR MANUFACTURING THE SAME

BACKGROUND OF THE INVENTION

1. Field of the Invention

The present invention relates to an electrode of an electric device, and more particularly to improvements in a composition of the electrode.

2. Description of Related Art

Methods are widely known wherein a conductive paste is used as the raw material of an electrode. Recently, base metal as a conductive material has come under review for cost cut. However, when an electrode is manufactured by firing process, the base metal such as copper powder oxidizes to raise resistivity. Such problem can be solved by firing in an inactive environment, for example, nitrogen filling system. But the production cost in total would become high, thereby the purpose of using the base metal is not fully achieved.

U.S. Pat. No. 4,070,517 discloses a firing-type of electrode containing glass, boron and base metal such as aluminum, copper or nickel, which is formed through firing at 600-700 deg C.

BRIEF SUMMARY OF THE INVENTION

An object is to provide an electrode that contains copper powder as the conductive material, that is formed by firing in air, and that has low resistivity.

An aspect of the invention relates to an electrode formed by firing in air a conductive paste comprising a copper powder, a boron powder, an additional inorganic powder, a glass frit, and an organic medium, wherein the additional inorganic powder is selected from the group consisting of silica powder, indium tin oxide powder, zinc oxide powder, alumina powder, and mixture thereof.

Another aspect of the invention relates to a method for manufacturing an electrode, comprising the steps of: applying a conductive paste comprising a copper powder and a boron powder, an additional inorganic powder, a glass frit, and an organic medium, wherein the additional inorganic powder is selected from the group consisting of silica powder, indium tin oxide powder, zinc oxide powder, alumina powder, and mixture thereof, drying the applied conductive paste, and firing the dried conductive paste in air.

The present invention enables the formation of a low-resistivity, fine pattern by air firing using an inexpensive conductive component. The present invention will contribute to a decrease in the cost of producing an electrode for an electronic device.

BRIEF DESCRIPTION OF THE DRAWINGS

FIG. 1 is a schematic diagram illustrating the manufacturing process of the electrodes using the photosensitive paste.

DETAILED DESCRIPTION OF THE INVENTION

An electrode is formed by firing in air a conductive paste comprising a copper powder, a boron powder, an additional inorganic powder, a glass frit, and an organic medium. The components of the conductive paste are explained respectively below as well as a method of forming the electrode using the conductive paste.

(I) Copper Powder

A conductive paste contains a copper powder to provide with conductivity.

In an embodiment, particle diameter of copper powder is less than 10 μm, in another embodiment, less than 6.0 μm, in another embodiment, less than 2.5 μm. In an embodiment, particle diameter of copper powder is at least 0.08 μm, in another embodiment, at least 0.2 μm, in another embodiment, at least 0.8 μm. When the particle diameter of copper powder is proper, the copper powder could be dispersed well in a conductive paste.

The particle diameter is obtained by measuring the distribution of the particle diameters by using a laser diffraction scattering method and can be defined as D50. Microtrac model X-100 is an example of the commercially-available devices.

The form of copper is not particularly limited. It can be in spherical or flake form.

In an embodiment of the present invention, the copper powder can be at least 30 parts by weight, in another embodiment, at least 33 parts by weight, in another embodiment, at least 35 parts by weight, based on 100 parts by weight of the conductive paste.

In an embodiment of the present invention, the copper powder can be not more than 88 parts by weight, in another embodiment, not more than 78 parts by weight, in another embodiment, not more than 70 parts by weight, in another embodiment, not more than 60 parts by weight, based on 100 parts by weight of the conductive paste.

When the copper powder is in the range above, conductivity of the electrode of the present invention could be sufficient.

A metal powder other than copper powder can be contained in the conductive paste, but from the standpoint of reducing the cost of raw materials, in an embodiment, a precious metal such as silver, gold, or palladium is not substantially contained therein. Herein the term "not substantially contained" is a concept that encompasses cases in which a precious metal is unintentionally contained as an impurity.

(II) Boron Powder

Boron powder is used to prevent oxidation of the copper during firing. The increase in electrode resistivity resulting from copper oxidation can be inhibited by adding boron powder to the conductive paste.

In an embodiment of the present invention, the boron powder can be at least 1.5 parts by weight, in another embodiment, at least 2.5 parts by weight, in another embodiment, at least 5 parts by weight, in another embodiment, at least 5.6 parts by weight, based on 100 parts by weight of the conductive paste.

In an embodiment of the present invention, the boron powder can be not more than 19 parts by weight, in another embodiment, not more than 15 parts by weight, in another embodiment, not more than 12 parts by weight, in another embodiment, not more than 10 parts by weight, based on 100 parts by weight of the conductive paste.

When the boron powder amount is in the range above, the oxidation of the copper powder could be sufficiently inhibited and the resistivity of the electrode could decrease.

In an embodiment of the present invention, the particle diameter can be not more than 5 μm, in another embodiment, not more than 3 μm, in another embodiment, not more than 2 μm. The lower limit of the particle diameter is not particularly limited, however, in an embodiment, boron powder with a particle diameter of 0.1 μm or more is preferable, from a viewpoint of uniform dispersibility of the boron powder in the conductive paste. The particle diameter can be measured in the same way as for the copper powder described above.

(III) Additional Inorganic Powder

Additional inorganic powder is silica ($SiO_2$) powder, indium tin oxide (ITO) powder, zinc oxide (ZnO) powder, alumina ($Al_2O_3$) powder or a mixture thereof.

In an embodiment, the additional inorganic powder can be a powder of silica powder, indium tin oxide powder, or mixture thereof, in another embodiment, silica powder. As shown in Example, silica powder could be the most effective on decreasing resistivity of an electrode.

In another embodiment, the additional inorganic powder can be a fumed silica powder. Fumed silica powder is a kind of silica powders that has high-surface area. Fumed silica powder can be produced by colliding and fusing micron-sized molten spheres of silica to form three dimensional, branched, chain-like aggregates. There are hydrophilic type of fumed silica and hydrophobic type of fumed silica. Both type of fumed silica can be used as the additional inorganic powder.

The amount of the additional inorganic powder depends on the total weight of the copper powder and the boron powder. In an embodiment of the present invention, the additional inorganic powder can be not more than 15 parts by weight, in another embodiment, not more than 12 parts by weight, in another embodiment, not more than 8 parts by weight, in another embodiment, not more than 5 parts by weight based on 100 parts by weight of the copper powder and the boron powder. When the additional inorganic is in the range above, the electrode resistance could be sufficiently low as shown in Table 1.

In an embodiment, the additional inorganic powder is at least 0.1 parts by weight, in another embodiment, at least 0.5 parts by weight, in another embodiment, at least 0.9 parts by weight, in another embodiment, at least 1.2 parts by weight based on 100 parts by weight of the copper powder and the boron powder. When the amount of the additional inorganic powder is in the range above, the effects such as low-resistivity and fine pattern forming by air firing could be sufficient.

In an embodiment, surface area (SA) of the additional inorganic powder can be 15 to about 380 $m^2/g$, in another embodiment, 90 to about 300 $m^2/g$, in another embodiment, 120 to 260 $m^2/g$, from a viewpoint of uniform dispersibility of the additional inorganic powder in the conductive paste. The specific surface area (SA) can be measured by a BET-point method (JIS-Z-8830). A Quantachrome Nova 3000 BET Specific Surface Area Analyzer is employed to measure the SA.

Mean particle diameter (D50) of the additional inorganic powder can be 5 nm to 1 μm in another embodiment, 10 nm to 200 nm in another embodiment, and 10 nm to 100 nm in still another embodiment. When the mean particle diameter is in the range, viscosity of the paste can be suitable for applying, for example, screen printing and it is small enough to make the thick film surface smooth. The mean particle diameter (PSD D50) means the particle diameter corresponding to 50% of the integrated value of the number of particles when the particle size distribution is prepared. The particle size distribution can be prepared using a commercially available measuring device such as the X100 by Microtrac.

(IV) Glass Frit

Glass frit used in the conductive paste promotes sintering of the copper powder and also facilitates binding of the electrode to the substrate.

Any kind of a glass frit can be used. In an embodiment, a glass frit can be a bismuth-based glass frit, a boric acid-based glass frit, a phosphorus-based glass frit, a lead-based glass frit or a mixture thereof. In another embodiment, glass frit can be a lead-free glass. Use of lead-containing material might be avoided in the consideration of a burden imposed on the environment.

The softening point of the glass frit is not especially limited. However, in an embodiment of the present invention, the softening point of the glass frit can be 300 to 700° C., in another embodiment, 350 to 650° C., in another embodiment, 550 to 600° C. When the softening point of the glass frit is in the range above, the glass frit could melt at a firing temperature that is usually less than 1000° C. In this specification, "softening point" is determined by differential thermal analysis (DTA).

In another embodiment of the present invention, the glass frit can be not more than 6.5 parts by weight, in another embodiment, not more than 5 parts by weight, in another embodiment, not more than 4 parts by weight, in another embodiment, not more than 3 parts by weight based on 100 parts by weight of the conductive paste.

In another embodiment, the glass frit can be at least 0.05 parts by weight, in another embodiment, at least 0.1 parts by weight, in another embodiment, at least 0.15 parts by weight, based on 100 parts by weight of the conductive paste.

When the glass frit is in the range above, sintering of copper powder and binding of the electrode to the substrate could be sufficient.

Glass frit can be prepared by methods well known in the art. For example, the glass component can be prepared by mixing and melting raw materials such as oxides, hydroxides, carbonates, making into a cullet by quenching, followed by mechanical pulverization (wet or dry milling). Thereafter, if needed, classification is carried out to the desired particle size.

(V) Organic Medium

Organic medium consists of a resin and optionally an organic solvent to have viscosity at least 100 Pa·s. The organic solvent can be added to the organic medium in order to adjust its viscosity. The inorganic powders such as a copper powder and boron powder are dispersed in an organic medium to form viscous composition called "paste", having proper consistency and rheology. An organic medium is burned off when an electrode is formed by firing a conductive paste.

Any resin can be used, for example, a non-acidic comonomer or an acidic comonomer. In another embodiment, a resin can be pine oil, ethylene glycol monobutyl ether monoacetate, polymethacrylate, ethyl cellulose or a mixture thereof.

However, when the conductive paste is photosensitive, the development in an aqueous system could be taken into consideration in selecting an organic binder. One with high resolution is preferred to be selected, for example, a resin that has a side chain of a hydroxyl group or a carboxyl group. An example of a resin that has a side chain of a hydroxyl group is hydroxypropyl cellulose. An example of a resin that has a side chain of a carboxyl group is an acrylic polymer.

In an embodiment, the resin can be a non-acidic comonomer, an acidic comonomer or a mixture thereof. In another embodiment, in case that the conductive paste is photosensitive, the resin can be a copolymer prepared from (1) non-acidic comonomers containing C1 to C10 alkyl acrylates, C1 to C10 alkyl methacrylates, styrene, substituted styrene, or combinations thereof, and (2) acidic comonomers containing ethylenic unsaturated carboxylic acid-containing components. When acidic comonomers are present in the conductive paste, the acidic functional groups will permit development in aqueous bases such as 0.8% sodium carbonate aqueous solution.

In an embodiment, the organic medium contains a resin and an organic solvent. In another embodiment, the solvent in the organic medium can be terpineol, ester alcohols. In another embodiment, the solvent in the organic medium can be an aliphatic alcohol and an ester of those alcohol such as an acetate ester or a propionate ester; terpene such as turpentine, alpha or beta terpineol, or a mixture thereof; ethylene glycol or an ester of ethylene glycol such as ethylene glycol monobutyl ether or butyl cellosolve acetate; butyl carbitol or esters of carbitol such as butyl carbitol acetate and carbitol acetate; and Texanol (2,2,4-trimethyl-1,3-pentanediol monoisobutyrate).

In an embodiment of the present invention, the organic medium can be 8 to 50 parts by weight, based on 100 parts by weight of the conductive paste. The amount of the organic medium can be selected depending on the desired viscosity of the conductive paste which is proper when applying.

(VI) Organic Additive

Organic additive can be added to the conductive paste as need arises. Organic additive can be, for example, dispersing agent, stabilizer, plasticizer, parting agent, stripping agent, antifoaming agent such as silicone oil and moistening agent or a mixture thereof. An appropriate additive can be selected based on the conventional technologies.

In an embodiment of the present invention, the conductive paste can be photosensitive. When being photosensitive, the conductive paste could further contain a photo polymerization initiator and a photo polymerization compound.

(VII) Photo Polymerization Initiator

Photo polymerization initiator is, in an embodiment, thermally inactive at 185° C. or lower, but it generates free radicals when it is exposed to an actinic ray.

In an embodiment, a photo polymerization initiator can be a compound that has two intramolecular rings in the conjugated carbocyclic ring system. This type of compound contains substituted or non-substituted multinuclear quinone.

In an embodiment, a photo polymerization initiator can be ethyl 4-dimethyl aminobenzoate, diethylthioxanthone, 2-Methyl-1[4-(methylthio)phenyl]-2-morpholinopropan-1-one, 9,10-anthraquinone, 2-methylanthraquinone, 2-ethylanthraquinone, 2-t-butylanthraquinone, octamethylanthraquinone, 1,4-naphtoquinone, 9,10-phenanthrenequinoen, benzo[a]anthracene-7,12 dione, 2,3-naphtacene-5,12-dione, 2-methyl-1,4-naphtoquinone, 1,4-dimethylanthraquinone, 2,3-dimethylanthraquinone, 2-phenylanthraquinone, 2,3-diphenylanthraquinone, retenequinone, 7,8,9,10-tetrahydronaphtacene-5,12-dione or 1,2,3,4-tetrahydrobenzo[a]anthracene-7,12-dione.

In another embodiment, a photo polymerization initiator can be ethyl 4-dimethyl aminobenzoate, diethylthioxanthone, 2-Methyl-1[4-(methylthio)phenyl]-2-morpholinopropan-1-one or a mixture thereof.

The photo polymerization initiator can be 0.1 to 5 parts by weight, based on 100 parts by weight of the conductive paste.

(V) Photo Polymerization Compound

Photo polymerization compound is an organic compound that includes ethylenic unsaturated compounds having at least one polymerizable ethylene group.

In an embodiment, the conductive paste can further contain a photo polymerization compound, when the conductive paste is photosensitive. Examples of the photo polymerization compound include, (metha)acrylic acid t-butyl, 1,5-pentandioldi(metha)acrylate, (metha)acrylic acid N,N-dimethylaminoethyl, ethyleneglycoldi(metha)acrylate, 1,4-butanedioldi(metha)acrylate, diethyleneglycoldi(metha)acrylate, hexamethyleneglycoldi(metha)acrylate, 1,3-propanedioldi(metha)acrylate, decamethyleneglycoldi(metha)acrylate, 1,4-cyclohexanedioldi(metha)acrylate, 2,2-dimethylolpropanedi(metha)acrylate, glyceroldi(metha)acrylate, tripropyleneglycoldi(metha)acrylate, glyceroltri(metha)acrylate, trimethylolpropanetri(metha)acrylate, ethocylated (6) trimethylolpropane triacrylate, 2,2-di(p-hydroxyphenyl)-propanedi(metha)acrylate, pentaetythritoltetra(metha)acrylate, dipentaerythritol Pentaacrylate, dipentaerythritol Tetraacrylate, triethyleneglycoldiacrylate, polyoxyetyl-1,2-di-(p-hydroxyetyl)propanedimethacrylate, bisphenolAdi-[3-(metha)acryloxy-2-hydroxypropyl]ether, bisphenolAdi-[2-(metha)acryloxyetyl]ether, 1,4-butanedioldi-(3-methacryloxy-2-hydroxypropyl)ether, triethyleneglycoldimethacrylate, polyoxypropyltrimethylolpropanetriacrylate, butyleneglycoldi(metha)acrylate, 1,2,4-butanedioltri(metha)acrylate, 2,2,4-trimethyl-1,3-pentandioldi(metha)acrylate, 1-phenylethylene-1,2-dimethacrylate, fumaric diallyl, styrene, 1,4-benzenedioldimethacrylate, 1,4-diisopropenylbenzene and 1,3,5-triisopropenylbenzene. Here, (metha)acrylate represents both acrylate and methacrylate.

In another embodiment, a photo polymerization compound can be dipentaerythritol pentaacrylate, ethocylated (6) trimethylolpropane triacrylate or a mixture thereof.

In an embodiment, the photo polymerization compound can be 5 to 35 parts by weight, in another embodiment 8 to 20 parts by weight, based on 100 parts by weight of the conductive paste. If the photo polymerization compound is too low, the exposure efficiency could drop, and the width of the electrode could become too narrow. In some cases, wire disconnections and shorts occur in the electrode due to poor exposure. On the other hand, if the compound amount is too high, the electrode resistivity could increase and surface stickiness could increase.

Next, the method of manufacturing an electrode using the conductive paste is explained. The method of manufacturing can be applied to any electrical devices, for example, a solar cell, a PDP, a resistor or an automotive window.

In an embodiment, the method can be applied to an electrical device that has a firing-type electrode on a substrate. An electrode of an electrical device can be formed with low cost by applying the method.

In an embodiment, the method can be applied to a solar cell electrode. A solar cell electrode can be formed by firing a conductive paste that is applied on a crystalline silicon substrate. In general, the firing time is short in order not to damage the crystalline silicon substrate so that the copper in the conductive paste could be oxidized less than other electrical devices where an electrode is formed by firing for long time.

In an embodiment, the method can be applied to an electrode of a PDP. An electrode of a PDP is especially required to be fine as well as cost-cut. A fine line electrode with low cost can be formed by the method. In another embodiment, the method can be applied to an electrode on a rear panel of a PDP, which is sometimes called address electrode. An address electrode is usually covered with a dielectric paste when firing so that the copper powder could be oxidized less than an electrode of other electrical devices where the conductive paste is fired upon exposure to air.

In an embodiment, the method can be applied to a resistor. An electrode a resistor can be formed with low cost by the method while especially there is a great need to reduce production cost.

In an embodiment, the method can be applied to an automotive window. An electrode on an automotive window can prevent a glass window from being fogged or frosted, for this reason often called a defogger or a defogging circuit. An electrode on an automotive window is rather required a certain level of resistivity which is relatively higher than electrodes of the other electric devices. Therefore, an electrode on an automotive window can be formed with low cost by the method.

In an embodiment, a method for manufacturing an electrode includes the steps of, applying a conductive paste that is described above, drying the applied conductive paste and firing the dried conductive paste in air.

First, the conductive paste is applied onto a substrate, for example, by screen printing. In an embodiment, the substrate can be a glass substrate, in another embodiment, a silicon substrate, in another embodiment, a ceramic substrate. A substrate can be selected depends on the device or a manufacturing process, for example, such as firing temperature.

Next, the applied conductive paste on the substrate can be dried, for example, for 10 to 20 minutes at 70 to 100° C. in an oven.

Next, the dried conductive paste is fired. A furnace which has a predetermined temperature and time profile can be used for the firing step. In an embodiment, the firing maximum temperature to set up the firing profile can be 400 to 980° C., in another embodiment, 600 to 980° C. In many cases, the maximum firing temperature can be set high enough to melt at least a glass frit. However, the maximum firing temperature can be lower due to a device or a substrate. For example, when the maximum firing temperature is too high, the substrate could warp.

In an embodiment, the firing time can be 0.5 to 3 hours, in another embodiment, 1 to 2.5 hours, in another embodiment, 1 to 2 hours. In an embodiment, the firing time can be 30 seconds to 5 minutes, in another embodiment, 45 seconds to 4 minutes, in another embodiment, 1 to 3 minutes. The firing time here is the time from starting firing and ending of firing, for example, from an entrance to an exit when using a furnace.

When the firing maximum temperature is relatively high, the firing time can be shorter, and when the firing maximum temperature is relatively low, the firing time can be longer. However, any other conditions can be taken into a consideration to select the firing maximum temperature and the firing time.

An example of the firing condition, the firing temperature can be 400 to 650° C. and firing time is 1 to 3 hours when the conductive paste is to form an electrode of plasma display panel (PDP). Another example, the firing temperature can be 600 to 980° C. and firing time is 30 seconds to 5 minutes when the conductive paste is to form a solar cell electrode.

Firing is carried out in an air atmosphere. As noted above, a low-resistivity can be formed even with air firing by controlling the composition of the conductive paste. In the specification, "firing in air" or "air firing" essentially refers to firing without replacing the atmosphere in the firing furnace, and more specifically it includes both firing without replacing the atmosphere in the firing furnace and firing with a replacement of 5 vol % or less of the atmosphere in the furnace.

After the firing, an electrode on a substrate can be obtained. In an embodiment, the electrode can be not more than 500 μm width in average, in another embodiment not more than 300 μm, in another embodiment not more than 150 μm, in another embodiment not more than 80 μm. In an embodiment, the electrode can be at least 10 μm width in average. When the electrode width is in the range above, the resistivity could be sufficiently low.

In an embodiment, the electrode can be 1 to 200 μm thickness.

In an embodiment, a method for manufacturing an electrode contains exposing the dried conductive paste, and developing the exposed photosensitive paste, between the step of drying and the step of firing described above. In this embodiment, the conductive paste is photosensitive. An example of the method contains the exposing step and the developing step can be the method for manufacturing an electrode of a PDP.

A method for manufacturing an electrode using the photosensitive paste will be explained with reference to the drawings.

In an embodiment of the present invention, the electrode can be an address electrode of a rear substrate for the PDP. The electrode has film thickness, form and pitch which are appropriate as the address electrodes for the PDP. In another embodiment of the present invention, the electrode can be an electrode formed on a front panel of a PDP.

FIG. 1 is a schematic diagram illustrating practical manufacturing procedures. First, a conductive photosensitive paste is applied on a substrate, for example, a glass substrate. The conductive photosensitive paste (104) can be fully applied on a glass substrate (102), for example, by screen-printing. The conductive photosensitive paste (104) can be applied with an applying tool (106) which uses a dispenser (FIG. 1(A)).

Next, the coated photosensitive paste is dried. The drying condition is not particularly limited if the layer of the photosensitive paste is dried. For example, it may be dried for 10 to 20 minutes at 70 to 100° C. in an oven. The conductive photosensitive paste can be dried by using a conveyer-type infrared drying machine.

Next, the dried photosensitive paste is patterned. In the patterning treatment, the dried photosensitive paste is exposed and developed. In the exposing process, photo mask (108) which has electrode patterns is placed on dried photosensitive paste (104) to which ultraviolet rays (110) are irradiated (FIG. 1(B)).

The exposing condition differs depending on the type of the photosensitive paste and the film thickness of the photosensitive paste. In an embodiment, an exposing step where a gap can be 200 to 400 μm can be used. In an embodiment, the light intensity exposure can be 100 to 8000 $mJ/cm^2$. In an embodiment, the irradiating period can be preferably 5 to 200 seconds.

In an embodiment, alkaline solution can be used for the development, for example, the alkaline solution can be 0.4% sodium carbonate solution. The development can be made by spraying alkaline solution (112) to exposed photosensitive paste layer (104) on substrate (102) (FIG. 1(C)) or immersing substrate (102) which has exposed photosensitive paste (104) into the alkaline solution.

Next, the patterned photosensitive paste is sintered (FIG. 1(D)). The composition can be fired in a furnace which has a predetermined temperature profile. In an embodiment, the maximum temperature to set up the profile can be 400 to 600° C., in another embodiment, 500 to 600° C. In an embodiment, the firing time can be 1 to 3 hours, in another embodiment, 1 to 2 hours.

In the present invention firing is carried out in an air atmosphere. As noted above, a low-resistivity, fine pattern can be formed even with air firing by controlling the composition of the photosensitive paste. In the present application, "firing in air" or "air firing" essentially refers to firing without replacing the atmosphere in the firing furnace, and more specifically it includes both firing without replacing the atmosphere in the firing furnace and firing with a replacement of 5 vol % or less of the atmosphere in the furnace.

After the sintering and cooling processes, substrate (103) with address electrodes (114) is obtained (FIG. 1(E)).

For use as a wiring material in the same manner as silver paste, the volume resistivity cannot be exceeded by a large amount compared to that of silver (for example, 100 times). If the volume resistivity becomes too large, substitution with copper becomes very difficult because a drastic design change is required. The volume resistivity of silver is 1.6× $10^{-6}$ Ω·cm near room temperature, so when a criterion of 100 times is established, it is preferable for the volume resistivity to be 1.6×$10^{-4}$ Ω·cm or less. It is possible to form such a low-resistivity electrode by using copper as the conductive component even if air firing is carried out.

The present invention is applicable to electronic devices that have an electrode, but the use is not particularly limited thereto. In an embodiment, the present invention is applicable to an electrode of a PDP. The production cost of a PDP can be reduced by using the present invention.

Example

The invention is illustrated in further detail below by examples using a conductive photosensitive paste. The examples are for illustrative purposes only, and are not intended to limit the invention.

1. Preparation of Conductive Paste

To obtain a photosensitive medium, a mixing tank was charged with 48.1 parts by weight of Texanol (2,2,4-trimethyl-1,3-pentanediol monoisobutyrate), 34.8 parts by weight of acrylic polymer having a molecular weight of 6,000 to 7,000. The mixture in the mixing tank was heated to 100° C. and stirred until all of acrylic polymer was dissolved. The resulting mixture was cooled down to 75° C.

The mixing tank was further charged with 17.2 parts by weight of a mixture of EDAB (ethyl 4-dimethyl aminobenzoate), DETX (diethylthioxanthone), and Irgacure 907 (2-Methyl-1[4-(methylthio)phenyl]-2-morpholinopropan-1-one) were added to the mixture in the mixing tank. The mixture was stirred at 75° C. until all the solids had dissolved. The solution was filtered through a 40 micron filter and cooled down to be an organic mixture.

19.8 parts by weight of the organic mixture was further mixed with 16 parts by weight g of a photo polymerization compound that is a mixture of Sartomer® SR494 (ethocylated (6) trimethylolpropane triacrylate) and Sartomer® SR399E (dipentaerythritol pentaacrylate), 0.6 parts by weight of organic additives, and 2.6 parts by weight of texanol solvent.

To this organic mixture, 0.3 parts by weight glass frit, 10.3 parts by weight of boron powder (H. C. Starck, Boron Amorphous I), and 48.7 parts by weight of copper powder (Dowa Electronics, KCL-35, D50=1.0 µm) were added to give "basic conductive paste".

The additional inorganic powders were then added to the basic conductive pastes respectively as shown in Table 1.

Fumed silica powder ("Aerosil 200" from Evonik Industries)

Indium tin oxide powder ("NanoTek Powder ITO" from C.I., Kasei, co.ltd.)

Zinc oxide powder ("Zinc oxide 0.02 um" from Wako Pure Chemical Industries LTD.)

Alumina powder, (Aeroxide Alu C" from Evonik Industries)

The conductive pastes were mixed until the additional inorganic powders were wet with the organic mediums. The mixtures were dispersed well using a 3-roll mill.

2. Preparation of Electrodes

Precautions were taken to avoid dirt contamination, as contamination by dirt during the preparation of the paste and the manufacture of the parts would have resulted in defects.

2-1: Applying

The conductive paste was applied to a glass substrate by screen printing using a poly #300 mesh screen to form 2×2 inch block pattern. The paste was then dried IR furnace for 10 minutes at 100° C., to give dried film with typically 6 to 8 um thickness.

2-2: Exposure

The dried paste was exposed to light through a photo mask using a collimated UV radiation source (illumination: 17-20 mW/$cm^2$; exposure: 1200 mJ/$cm^2$), with 200 um gap.

2-3: Development

An exposed sample was placed on a conveyor and then placed in a spray developing device filled with 0.4 wt % sodium carbonate aqueous solution as the developer. The developer was kept at a temperature of 30° C., and was sprayed at 10 to 20 psi.

The developing time was decided in the following manner. First the time for an unexposed dry film to be washed in the developer (TTC, Time To Clear) was measured by printing under the same conditions as for a sample with an exposed pattern and using that dried unexposed sample. Next, a sample part with an exposed pattern was developed with the developing time set to 1.5 times TTC.

The developed sample was dried by blowing off the excess water with an air jet.

2-4: Firing

A furnace (Roller Hearth Continuous Furnaces, KOYO THERMO SYSTEMS KOREA CO., LTD.) was charged with the dried conductive paste to be fired in air. The firing maximum temperature was 590° C. in the firing profile. The firing time was 1.5 hours. The fired electrode had thickness of 3.7 µm and width of 100 µm or 50 µm and length of 44 cm.

3: Measurement

Volume resistivity of the fired film was calculated by following equation (1).

Volume resistivity (Ohm·cm)=width (cm) of the electrode×thickness (cm) of the electrode×Resistivity/length (cm) of the electrode (1)

4: Result

In example 1 to 8, copper and boron paste with an additional inorganic powder, rather surprisingly, the electrodes pattern with 100 µm design width showed good resistivity with less than 8.0×$10^{-5}$ Ohm·cm resistivity.

In example 1 to 6, copper and boron pastes with the additional inorganic powders showed good resistivity with less than 8.0×$10^{-5}$ Ohm·cm resistivity, even at the narrower electrodes with 50 µm width pattern.

On the other hand, comparative example 1 and 2 without the additional inorganic powder or too much of the additional inorganic powder, resistivity at 100 urn width pattern and at 50 urn width pattern were too high to measure.

TABLE 1

| | Additional inorganic powder | Amount (parts by wt vs. Cu + B) | Volume resistivity ($\times10^{-5}$ Ohm · cm) 100 µm width | 50 µm width |
|---|---|---|---|---|
| Example 1 | $SiO_2$ | 1.7 | 2.4 | 2.3 |
| Example 2 | $SiO_2$ | 3.4 | 3.0 | 2.6 |
| Example 3 | ITO | 1.7 | 3.4 | 3.5 |
| Example 4 | ITO | 3.4 | 3.3 | 3.2 |
| Example 5 | ZnO | 3.4 | 2.9 | 2.7 |
| Example 6 | ZnO | 8.5 | 7.2 | 7.2 |
| Example 7 | $Al_2O_3$ | 1.7 | 3.2 | —* |
| Example 8 | $Al_2O_3$ | 3.4 | 3.9 | —* |
| Comparative example 1 | ZnO | 17.0 | —* | —* |
| Comparative example 2 | None | 0.0 | —* | —* |

*unmeasurable level

What is claimed is:

1. An electrode formed by firing in air a conductive paste comprising a copper powder, a boron powder, an additional inorganic powder, a glass frit, and an organic medium, wherein the additional inorganic powder is selected from the group consisting of silica powder, indium tin oxide powder, zinc oxide powder, alumina powder, and mixture thereof, and the surface area(SA) of the additional inorganic powder is 15 $m^2/g$ to 380 $m^2/g$, and wherein the particle diameter (D50) of the boron powder is 0.1 to 5 μm.

2. The electrode according to claim 1, wherein the copper powder is 30 to 88 parts by weight, based on 100 parts by weight of the conductive paste.

3. The electrode according to claim 1, wherein the boron powder is 1.5 to 19 parts by weight, based on 100 parts by weight of the conductive paste.

4. The electrode according to claim 1, wherein the glass frit is 0.1 to 6.5 parts by weight based on 100 parts by weight of the conductive paste.

5. The electrode according to claim 1, wherein the additional inorganic powder is in the range of 0.1 to 15 parts by weight based on 100 parts by weight of the copper powder and the boron powder.

6. The electrode according to claim 5, wherein the additional inorganic powder is in the range of 0.5 to 8 parts by weight based on 100 parts by weight of the copper powder and the boron powder.

7. The electrode according to claim 1, wherein the conductive paste further comprising a photo-polymerization compound and a photo-polymerization initiator.

8. The electrode according to claim 1, wherein the additional inorganic powder is fumed silica powder.

* * * * *